US009068263B2

(12) United States Patent
Reynolds et al.

(10) Patent No.: US 9,068,263 B2
(45) Date of Patent: Jun. 30, 2015

(54) APPARATUS FOR MANUFACTURE OF SOLAR CELLS

(75) Inventors: Reese Reynolds, Sonora, CA (US); H. William Lucas, Jr., Watsonville, CA (US); Tyke Johnson, Sonora, CA (US)

(73) Assignee: Sandvik Thermal Process, Inc., Sonora, CA (US)

( * ) Notice: Subject to any disclaimer, the term of this patent is extended or adjusted under 35 U.S.C. 154(b) by 745 days.

(21) Appl. No.: 12/711,838

(22) Filed: Feb. 24, 2010

(65) Prior Publication Data

US 2010/0218725 A1 Sep. 2, 2010

Related U.S. Application Data

(60) Provisional application No. 61/155,948, filed on Feb. 27, 2009.

(51) Int. Cl.
| | | |
|---|---|---|
| *C23C 16/455* | (2006.01) | |
| *C23C 16/458* | (2006.01) | |
| *C23C 16/52* | (2006.01) | |
| *H01L 21/306* | (2006.01) | |
| *C23F 1/00* | (2006.01) | |
| *C23C 16/44* | (2006.01) | |
| *H01L 31/18* | (2006.01) | |
| *C23C 16/06* | (2006.01) | |
| *C23C 16/22* | (2006.01) | |

(52) U.S. Cl.
CPC ..... *C23C 16/45578* (2013.01); *C23C 16/45546* (2013.01); *C23C 16/45548* (2013.01); *C23C 16/4412* (2013.01); *H01L 31/1876* (2013.01); *Y02E 10/50* (2013.01)

(58) Field of Classification Search
CPC ............ C23C 16/45578; C23C 16/45548; C23C 16/45546; C23C 16/4412; H01L 31/1876; Y02E 10/50
USPC .......... 118/715; 156/345.33, 345.51
See application file for complete search history.

(56) References Cited

U.S. PATENT DOCUMENTS

| | | | | |
|---|---|---|---|---|
| 4,062,318 A | * | 12/1977 | Ban et al. ............. | 118/725 |
| 4,401,689 A | * | 8/1983 | Ban ...................... | 427/589 |
| 4,499,853 A | * | 2/1985 | Miller .................. | 118/725 |
| 4,534,312 A | * | 8/1985 | Shinya et al. ........ | 118/666 |
| 4,573,431 A | * | 3/1986 | Sarkozy .............. | 118/725 |

(Continued)

FOREIGN PATENT DOCUMENTS

| | | |
|---|---|---|
| CN | 1878889 | 12/2006 |
| JP | 54-103750 | 7/1979 |

(Continued)

OTHER PUBLICATIONS

Singapore Written Opinion for Singapore Patent Application No. 201106196-7, dated Aug. 21, 2012.

(Continued)

*Primary Examiner* — Rudy Zervigon
(74) *Attorney, Agent, or Firm* — Morgan, Lewis & Bockius LLP

(57) ABSTRACT

The present invention relates to equipment used to manufacture PV cells or modules. In some embodiments, a gas delivery and gas exhaust system are provided for processing a plurality of substrates. The gas delivery and gas exhaust system are designed such that the substrates are exposed in a uniform manner to the gas.

14 Claims, 3 Drawing Sheets

(56) References Cited

U.S. PATENT DOCUMENTS

| | | | |
|---|---|---|---|
| 4,854,266 A * | 8/1989 | Simson et al. | 118/728 |
| 4,992,301 A * | 2/1991 | Shishiguchi et al. | 118/724 |
| 5,097,890 A * | 3/1992 | Nakao | 165/206 |
| 5,228,114 A * | 7/1993 | Suzuki | 392/416 |
| 5,239,614 A * | 8/1993 | Ueno et al. | 392/416 |
| 5,383,984 A * | 1/1995 | Shimada et al. | 156/345.26 |
| 5,441,570 A * | 8/1995 | Hwang | 118/725 |
| 5,591,268 A * | 1/1997 | Usui et al. | 118/723 E |
| 5,925,188 A * | 7/1999 | Oh | 118/715 |
| 5,994,675 A * | 11/1999 | Bethune et al. | 219/483 |
| 6,135,053 A * | 10/2000 | Okamura | 118/723 E |
| 6,352,593 B1 * | 3/2002 | Brors et al. | 118/724 |
| 6,406,983 B1 | 6/2002 | Hölzlein et al. | |
| 6,444,262 B1 | 9/2002 | Kitamura et al. | |
| 6,737,613 B2 * | 5/2004 | Yamaguchi et al. | 219/390 |
| 6,881,295 B2 * | 4/2005 | Nagakura | 156/345.33 |
| 7,138,607 B2 * | 11/2006 | Wang et al. | 219/390 |
| 8,080,767 B2 * | 12/2011 | Yamaga et al. | 219/441 |
| 8,148,271 B2 * | 4/2012 | Ueno et al. | 438/748 |
| 2005/0098107 A1 | 5/2005 | Du Bois et al. | |
| 2006/0021573 A1 * | 2/2006 | Monsma et al. | 118/715 |
| 2007/0137794 A1 | 6/2007 | Qiu et al. | |
| 2008/0210168 A1 | 9/2008 | Su et al. | |
| 2009/0291566 A1 * | 11/2009 | Ueno et al. | 438/758 |
| 2009/0311807 A1 * | 12/2009 | Yamaga et al. | 438/5 |
| 2010/0186667 A1 * | 7/2010 | Ishii et al. | 118/712 |
| 2010/0218725 A1 * | 9/2010 | Reynolds et al. | 118/728 |
| 2012/0094010 A1 * | 4/2012 | Sugiura et al. | 427/8 |

FOREIGN PATENT DOCUMENTS

| | | | | |
|---|---|---|---|---|
| JP | 60-257129 | | 12/1985 | |
| JP | 63-35776 | | 2/1988 | |
| JP | 01048426 A | * | 2/1989 | H01L 21/31 |
| JP | 6-349761 | | 12/1994 | |
| JP | 2006-179819 | | 7/2006 | |

OTHER PUBLICATIONS

Notice of Reasons for Rejection (with English translation) for Japanese Application No. 2011-552177, dated Dec. 3, 2013.
Notification of the First Office Action (with English translation), for Chinese Application No. 201080009813.7, dated Jan. 11, 2013.
English translation of Notification of the Second Office Action for Chinese Patent Application No. 201080009813.7. dated Jul. 1, 2013.
Singapore Written Opinion for Singapore Application No. 201106196-7, dated Mar. 8, 2013.

* cited by examiner

APPARATUS FOR MANUFACTURE OF SOLAR CELLS

CROSS REFERENCE TO PRIOR APPLICATION

This application claims priority to U.S. Provisional Application No. 61/155,948 filed Feb. 27, 2009, which is incorporated by reference herein.

FIELD OF INVENTION

This invention relates generally to the field of equipment used in the manufacture of photovoltaic (PV) solar cells or thin film (TF) modules. In some embodiments, the present invention relates to a gas delivery system and a gas exhaust system

BACKGROUND OF THE INVENTION

Solar energy is widely accepted as being an excellent source of renewable energy. Photovoltaic (PV) cells which can convert sunlight into electricity have been studied for the past ~70 years. The adoption and wide spread use of PV cells has been slow because they have exhibited poor conversion efficiency and have been expensive to manufacture. Therefore, the economics ($/Watt) of using PV cells to generate electricity have not been competitive with traditional sources such as coal, oil, natural gas, etc. The $/Watt metric represents the total system cost to generate a Watt of energy. Lower PV solar cell efficiencies and higher PV solar cell system costs increase this metric and lowers the competitiveness of the PV solar cell system relative to traditional energy generation systems.

Recent advances in the design and manufacture have improved the efficiency of the PV solar cells and lowered the manufacturing cost such that PV based solar energy systems have improved economics. It is a goal that PV based solar energy systems will be able to generate electricity at costs that are competitive with traditional electricity generation methods in the near future. For this goal to be realized, advances must be made to continue to improve the conversion efficiency of the PV solar cells and to lower the manufacturing costs.

In another step in the manufacture of PV solar cells or TF modules, substrates are often processed in equipment used to expose the substrates to various gases. The substrates may be heated and the gases may be used to dope the substrates to change their electrical or chemical properties, deposit materials on the substrates, remove materials from the substrates, or change the surface properties of the substrates among others. In the case wherein the equipment contains a large enclosure used to treat a large batch of substrates simultaneously, it is important that the substrates are processed uniformly.

Current equipment used for treating substrates with a gas during the manufacture of PV based solar cells or TF modules suffer from a number of problems. Examples of these problems may be high equipment cost, low throughput, large footprint, poor performance, non-uniform supply of the gas, non-uniform exhaust of the reaction by-products, and others. These problems may act individually or in combination to lower the efficiency of the PV solar cells or TF modules or increase the cost of manufacturing the PV solar cells or modules. This will increase the $/Watt economic metric used to evaluate energy system performance and slow the adoption of PV solar energy systems. Therefore, there is a need for gas delivery and exhaust handling systems to be used in equipment used to manufacture PV solar cells or modules that address these problems.

SUMMARY OF THE INVENTION

In some embodiments of the present invention, gas delivery and exhaust systems are provided for use in an enclosure used to process solar cell or TF module substrates. The gas delivery system comprises one or more injectors with one or more holes arranged along the length of the injectors. The holes are arranged with a range of angles relative to the centerline of the substrates so that the substrates are uniformly exposed to the gas from the injectors. Additionally, the gas exhaust system comprises one or more exhaust manifolds with one or more holes arranged along the length of the manifolds. The holes are arranged with a range of angles relative to the centerline of the substrates so that the substrates are uniformly exposed to the gas from the delivery gas injectors as the reaction by-products are removed from the enclosure. The relative sizes of the holes in the gas delivery injectors and the gas exhaust manifolds are chosen so that the substrates are uniformly exposed to the gas from the delivery gas injectors.

These and other advantages are achieved in accordance with the present invention as described in detail below.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not to scale.

The techniques of the present invention can readily be understood by considering the following detailed description in conjunction with the accompanying drawings, in which.

DETAILED DESCRIPTION OF THE INVENTION

After considering the following description, those skilled in the art will clearly realize that the teachings of the invention can be readily utilized in the manufacture of PV solar cells or TF modules.

One configuration of PV solar energy systems comprises PV solar modules. One version of PV solar modules may be constructed of a plurality of PV solar cells connected in series or parallel. The PV solar cells may be based on single crystal semiconductor substrates or on polycrystalline semiconductor substrates. Examples of suitable semiconductor substrates comprise Si, poly-Si, and GaAs, among others. For economy of language within the current disclosure, the phrase "PV solar cell" will be understood to mean the semiconductor substrates used in the manufacture of a PV solar module.

A second version of PV solar modules may be constructed by applying thin films of semiconductor materials on rigid substrates or flexible substrates. Examples of semiconductor thin films comprise a-Si, CdTe, CIGS (Cu—In—Ga—S; or Cu—In—Ga—Se), and organic semiconductor materials, among others. An example of a typical rigid substrate is a glass sheet. Examples of flexible substrates comprise metal rolls or foils, rolls of polymer materials, and other flexible materials. For economy of language within the current disclosure, the phrase "TF module" will be understood to mean the formation of the PV solar module by the application of thin films of semiconductor materials onto a rigid substrate or a flexible substrate.

Typical manufacturing sequences for the production of PV solar cells or TF modules comprise steps wherein the substrates are exposed to a variety of gases while being held at an elevated temperature. The gases interact with the substrates to enable a number of processes. Examples of these processes include the introduction of dopant species to alter the electrical characteristics of the substrate (i.e. doping with B, P, As, etc.), the reaction of the gases with the substrate surface to grow a thin film (i.e. oxidation of Si to form $SiO_2$), the reaction of gases to deposit a thin film on the surface of the substrate (i.e. deposition of $Si_xN_y$), reaction of the gases with the substrate surface or with a thin film on the surface to remove material from the surface (i.e. removal of dielectric layers from the surface). In the manufacture of PV solar cells or TF modules, it is typical that the substrates are processed within a furnace. The horizontal furnace is a common system for the treatment of substrates during the manufacture of PV solar cells. Horizontal furnaces have the capacity to process as many as 500 substrates in a single process sequence. Furthermore, horizontal furnace systems typically comprise up to four processing chambers that allow up to 2000 substrates to be processed in parallel.

Figure 1:
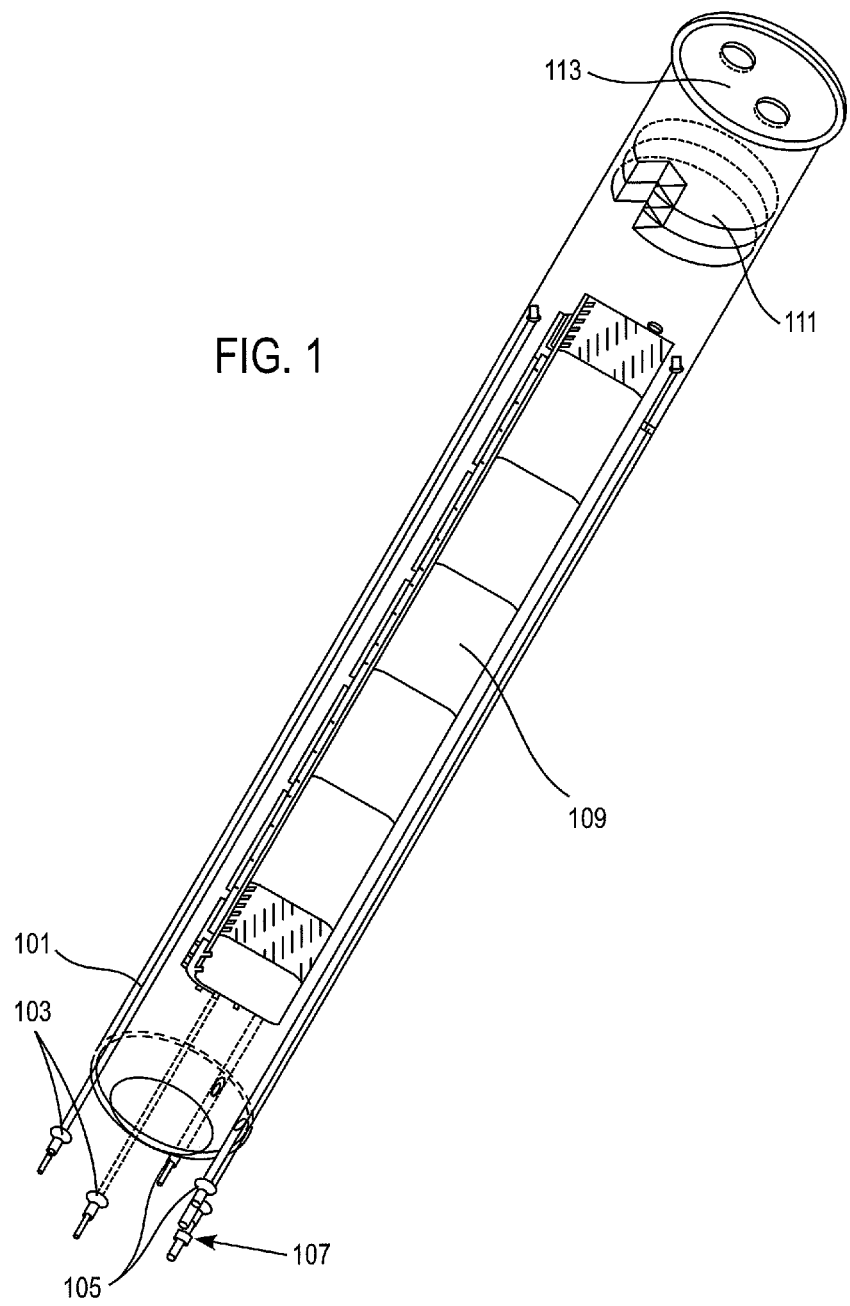
FIG. 1 is a schematic illustration of a processing system according to one embodiment of the present invention.

FIG. 1 is a schematic illustration of a processing system according to one embodiment of the present invention. The process chamber 101 is typically a quartz tube. The process chamber is generally contained within a heating system (not shown) with a circular cross-section. The heating system typically comprises multiple control zones so that the temperature may be independently controlled along the length of process chamber 101. The heating system and the processing chamber are typically arranged in a co-axial configuration. The multiple control zones of the heater are monitored using a multijunction thermocouple (TC) assembly that is contained within a quartz sheath 107 integrated within process chamber 101. The TC assembly contains at least one TC junction for each control zone. The substrates 109 are contained within process chamber 101 during the process sequence. The substrates are introduced into the process chamber through one open end of the process chamber. During the processing sequence, the open end of the tube may be closed by a door mechanism 113 to prevent the gases from escaping from the process chamber. A thermal assembly 111 is placed between the substrates and the door mechanism to improve the thermal uniformity within the process chamber and to protect the door mechanism from exposure to high temperatures.

In traditional horizontal furnaces, gases are introduced through one end of the process chamber and exhausted from the opposite end. Differences in substrate temperature, gas temperature, gas flow velocity, and gas composition lead to non-uniform interaction between the substrates and the gases.

In some embodiments of the present invention, gases are introduced through one or more injector manifolds 103 that are contained within the process chamber. Injector manifolds 103 are sealed tubes that contain at least three distribution holes along their length. The distribution hole size may be equal or may vary along the length of the injector manifolds. The distribution hole size may be equal or may vary between injector manifolds for configurations wherein more than one injector manifold is utilized. The distribution hole spacing may be equal or may vary along the length of the injector manifolds. The distribution hole spacing may be equal or may vary between injector manifolds for configurations wherein more than one injector manifold is utilized.

In some embodiments of the present invention, reaction by-products are exhausted through one or more exhaust manifolds 105 that are contained within the process chamber. Exhaust manifolds 105 are sealed tubes that contain at least three exhaust holes along their length. The number of holes within the exhaust manifolds may be less than, equal to, or greater than the number of holes in the injector manifolds. Advantageously, the number of holes within the exhaust manifolds is about equal to the number of holes in the injector manifolds. The exhaust hole size may be equal or may vary along the length of the exhaust manifolds. The exhaust hole size may be equal or may vary between exhaust manifolds for configurations wherein more than one exhaust manifold is utilized. The total area of the holes within the exhaust manifolds (i.e. area summed over all of the holes within all of the exhaust manifolds) may be less than, equal to, or greater than the total area of the holes within the injector manifolds (i.e. area summed over all of the holes within all of the injector manifolds). Advantageously, the total area of the holes within the exhaust manifolds is about twice the total area of the holes within the injector manifolds. The exhaust hole spacing may be equal or may vary along the length of the exhaust manifolds. The exhaust hole spacing may be equal or may vary between exhaust manifolds for configurations wherein more than one exhaust manifold is utilized. The exhaust hole spacing may be less than, equal to, or grater than the hole spacing of the injector manifolds. Advantageously, the exhaust hole spacing may be about equal to the hole spacing of the injector manifolds.

Figure 2:
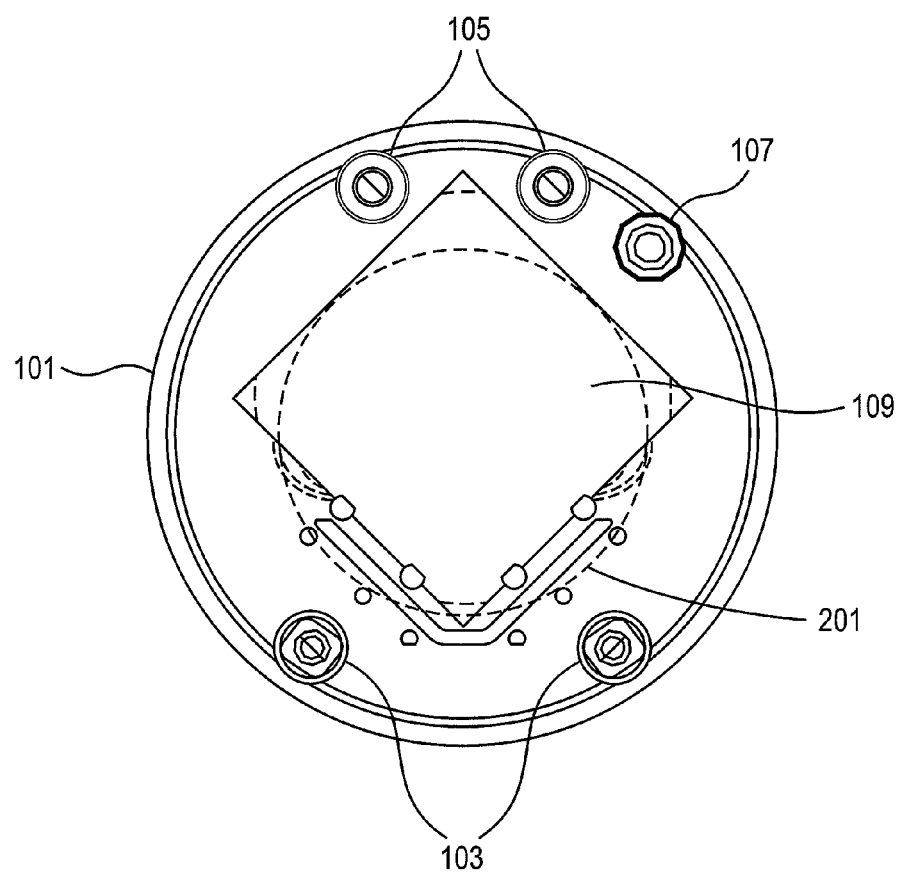
FIG. 2 is a schematic illustration of a cross-sectional view through the processing system of FIG. 1.

FIG. 2 is a schematic illustration of a cross-sectional view through the processing system of FIG. 1. The substrates 109 are held within carriers or boats 201 (typically made of quartz) and are roughly centered within process chamber 101. The thermocouple assembly used for the control of the heater assembly (not shown) is contained within sheath 107 positioned within process chamber 101.

Gases are introduced through one or more injector manifolds 103 that are contained within the process chamber. The injector manifolds are illustrated as being configured below the substrates, but they may be placed in any configuration within the process chamber (i.e. top, sides, etc.). FIG. 2 illustrates two gas injector manifolds, but clearly any number may be used.

The reaction by-products are exhausted through one or more exhaust manifolds 105 that are contained within the process chamber. The exhaust manifolds are illustrated as being configured above the substrates, but they may be placed in any configuration within the process chamber (i.e. bottom, sides, etc.). The injector manifolds and the exhaust manifolds are advantageously configured on opposite side of the process chamber (i.e. top/bottom, left-side/right-side) so that the gas flows from the injector manifold, across the substrate surfaces, and into the exhaust manifolds. FIG. 2 illustrates two gas exhaust manifolds, but clearly any number may be used.

Figure 3:
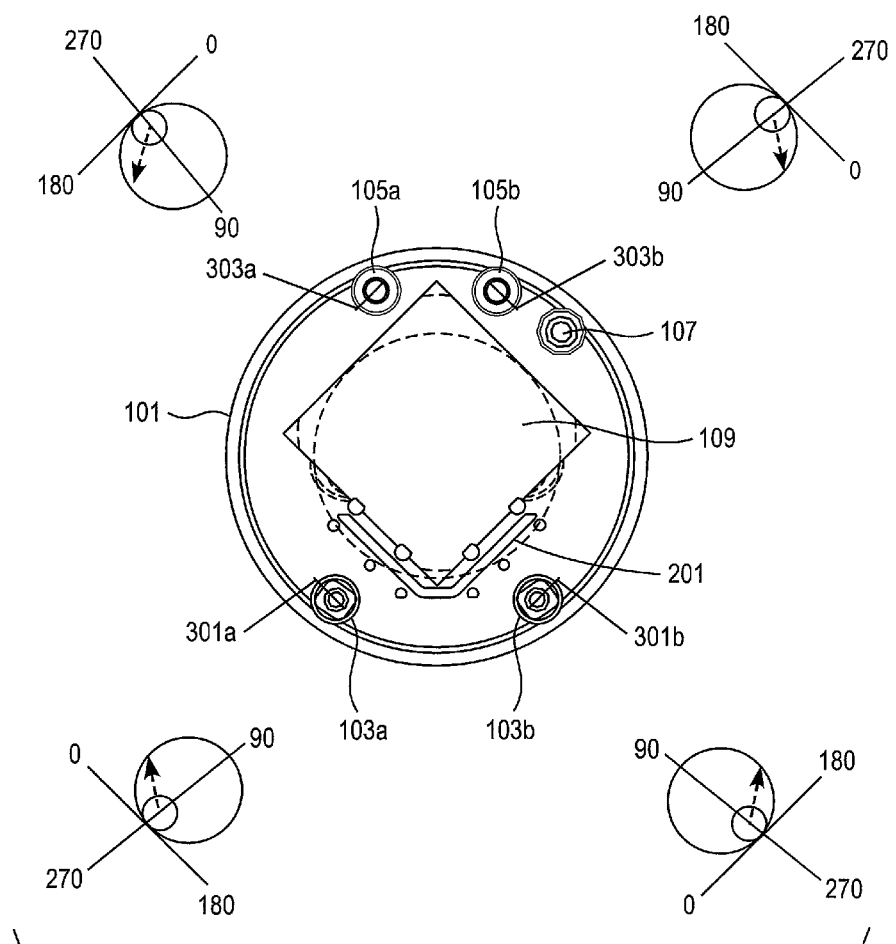
FIG. 3 is a schematic illustration of a cross-sectional view through the processing system of FIG. 1.

FIG. 3 is a schematic illustration of a cross-sectional view through the processing system of FIG. 1. The alignment of the exit holes of the injector manifolds are indicated by the lines 301a, 301b. The alignment angle of the exit holes of the injector manifolds influences the uniformity of the reaction of the gases with the substrates. The alignment angles of the exit holes of the injector manifolds will be described using the legend indicated in FIG. 3 wherein an alignment angle of "0-degrees" will be understood to describe an injector manifold wherein the gas exits the injector manifold at an angle parallel to the tangent line drawn through the point where the injector manifold touches the process chamber. The alignment angle will increase by moving along the circle in a clockwise manner and the 90-degree angle always points toward the longitudinal axis of the process chamber as indicated. Representative angles of 90-degrees, 180-degrees, and 270-degrees have been shown for each of the injector manifolds 301a and 301b.

The alignment angle 301a of injector manifold 103a may be between 0-degrees and 180-degrees and is advantageously between 30-degrees and 60-degrees. The alignment angle 301b of injector manifold 103b may be between 0-degrees and 180-degrees and is advantageously between 120-degrees and 150-degrees.

The alignment of the entrance holes of the exhaust manifolds are indicated by the lines 303a, 303b. The alignment angle of the entrance holes of the exhaust manifolds influences the uniformity of the reaction of the gases with the substrates. The alignment angles of the exit holes of the exhaust manifolds will be described using the legend indicated in FIG. 3 wherein an alignment angle of "0-degrees" will be understood to describe an exhaust manifold wherein the gas exits the exhaust manifold at an angle parallel to the tangent line drawn through the point where the exhaust manifold touches the process chamber. The alignment angle will increase by moving along the circle in a clockwise manner and the 90-degree angle always points toward the center of the process chamber as indicated. Representative angles of 90-degrees, 180-degrees, and 270-degrees have been shown for each of the exhaust manifolds 303a and 303b.

The alignment angle 303a of exhaust manifold 105a may be between 0-degrees and 180-degrees and is advantageously between 120-degrees and 150-degrees. The alignment angle 303b of exhaust manifold 105b may be between 0-degrees and 180-degrees and is advantageously between 30-degrees and 60-degrees.

Although various embodiments which incorporate the teachings of the present invention have been shown and described in detail herein, those skilled in the art can readily devise many other varied embodiments that still incorporate these teachings.

What is claimed is:

1. An apparatus for the treatment of substrates comprising:
a process chamber capable of holding a plurality of substrates;
wherein the process chamber is substantially cylindrical in shape having a longitudinal axis;
wherein the process chamber comprises one or more injector manifolds contained therein, the one or more injector manifolds having longitudinal axes substantially parallel to the longitudinal axis of the process chamber;
wherein the process chamber comprises one or more exhaust manifolds contained therein, the one or more exhaust manifolds having longitudinal axes substantially parallel to the longitudinal axis of the process chamber;
wherein the process chamber comprises one or more sheaths for holding thermocouples contained therein, the one or more sheaths for holding thermocouples having longitudinal axes substantially parallel to the longitudinal axis of the process chamber;
wherein the process chamber is substantially closed at a first end of the cylindrical shape and open at a second end of the cylindrical shape, the first end opposite the second end along the longitudinal axis of the process chamber;
wherein the first closed end has penetrations through the first closed end wall for the one or more injector manifolds, the one or more exhaust manifolds, and the one or more sheaths for holding thermocouples;
wherein the process chamber includes a door mechanism to close the open second end of the process chamber;
wherein the one or more injector manifolds comprise holes distributed along their length and the one or more exhaust manifolds comprise holes distributed along their length; and
wherein there are at least two injector manifolds and the holes in a first injector manifold are oriented at an angle between 30 and 60 degrees and the holes in a second injector manifold are oriented at an angle between 120 and 150 degrees, where a 0 degree angle is the angle parallel to the tangent line drawn through the point where the manifold touches the process chamber and the angles increase in a clockwise manner and the 90 degree angle points toward the longitudinal axis of the process chamber.

2. An apparatus as in claim 1 wherein the one or more injector manifolds are located on the opposite side of the process chamber from the one or more exhaust manifolds.

3. An apparatus as in claim 2 wherein the one or more injector manifolds comprise at least three holes distributed along their length and the one or more exhaust manifolds comprise at least three holes distributed along their length.

4. An apparatus as in claim 3 wherein the at least three holes of the injector manifolds are distributed evenly along the length of the one or more injector manifolds.

5. An apparatus as in claim 3 wherein the at least three holes of the injector manifolds are distributed unevenly along the length of the one or more injector manifolds.

6. An apparatus as in claim 3 wherein the at least three holes distributed along the length of the one or more injector manifolds have substantially equal size.

7. An apparatus as in claim 3 wherein the at least three holes distributed along the length of the one or more injector manifolds have substantially unequal size.

8. An apparatus as in claim 3 wherein the at least three holes of the exhaust manifolds are distributed evenly along the length of the one or more exhaust manifolds.

9. An apparatus as in claim 3 wherein the at least three holes of the exhaust manifolds are distributed unevenly along the length of the one or more exhaust manifolds.

10. An apparatus as in claim 3 wherein the at least three holes distributed along the length of the one or more exhaust manifolds have substantially equal size.

11. An apparatus as in claim 3 wherein the at least three holes distributed along the length of the one or more exhaust manifolds have substantially unequal size.

12. An apparatus as in claim 3 wherein the sum of the areas of the at least three holes distributed along the length of the one or more exhaust manifolds is equal to or greater than the sum of the areas of the at least three holes distributed along the length of the one or more injector manifolds.

13. An apparatus as in claim 1 wherein there are at least two exhaust manifolds and the holes in a first exhaust manifold are oriented at an angle between 120 and 150 degrees and the holes in a second exhaust manifold are oriented at an angle between 30 and 60 degrees.

14. An apparatus as in claim 1 wherein the process chamber is a quartz tube and the only penetrations through the quartz tube are through the first closed end wall.

* * * * *